US012772491B2

(12) United States Patent
Zhang

(10) Patent No.: US 12,772,491 B2
(45) Date of Patent: Oct. 20, 2026

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Lijie Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 636 days.

(21) Appl. No.: 18/200,931

(22) Filed: May 23, 2023

(65) Prior Publication Data

US 2023/0402540 A1 Dec. 14, 2023

(30) Foreign Application Priority Data

May 23, 2022 (CN) ......................... 202210563935.5

(51) Int. Cl.

| | |
|---|---|
| ***H10W 10/17*** | (2026.01) |
| ***H10D 30/01*** | (2025.01) |
| ***H10D 30/60*** | (2025.01) |
| ***H10D 30/65*** | (2025.01) |
| ***H10D 62/10*** | (2025.01) |

(52) U.S. Cl.

CPC ........... *H10D 30/65* (2025.01); *H10D 30/023* (2025.01); *H10D 30/0281* (2025.01); *H10D 30/611* (2025.01); *H10D 62/103* (2025.01); *H10D 62/115* (2025.01)

(58) Field of Classification Search

CPC .. H10D 30/65; H10D 30/023; H10D 30/0281; H10D 30/611; H10D 62/103; H10D 62/115; H10D 30/0221; H10D 30/0285; H10D 30/603; H10D 64/017; H10D 62/116; H10D 64/117; H10D 64/512

USPC .......................................................... 257/339

See application file for complete search history.

(56) References Cited

U.S. PATENT DOCUMENTS

2023/0335636 A1* 10/2023 Shi ........................ H10D 30/603
2024/0347626 A1* 10/2024 Yang .................. H10D 30/0281

FOREIGN PATENT DOCUMENTS

CN 104701366 A 6/2015

* cited by examiner

*Primary Examiner* — Theresa T Doan

(74) *Attorney, Agent, or Firm* — Anova Law Group, PLLC

(57) ABSTRACT

A semiconductor structure includes a substrate, a body region and a drift region in the substrate, a first gate structure over the body region and the drift region, a second gate structure over the drift region, a source in the body region, and a drain in the drift region. The first gate structure is between the source and the drain. The second gate structure is between the first gate structure and the drain.

20 Claims, 6 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202210563935.5, filed on May 23, 2022, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

Lateral double-diffused metal-oxide-semiconductor field-effect transistor (LDMOS) is a high-voltage power device. Since electrical currents flow laterally along the surface of the device, the fabrication process of LDMOS is compatible with complementary metal-oxide semiconductor (CMOS) technologies. In addition, compared to traditional power devices, LDMOS devices have merits such as high breakdown voltage and low on-resistance and thus are widely used in various fields. However, the existing LDMOS devices have some performance and reliability issues.

The disclosed structures and methods are directed to at least partially alleviate one or more problems set forth above and to solve other problems in the art.

SUMMARY

One aspect of the present disclosure provides a semiconductor structure that includes a substrate, a body region and a drift region in the substrate, a first gate structure over the body region and the drift region, a second gate structure over the drift region, a source in the body region, and a drain in the drift region. The first gate structure is between the source and the drain. The second gate structure is between the first gate structure and the drain Another aspect of the present disclosure provides a method for forming a semiconductor structure. The method includes providing a substrate, forming a body region and a drift region in the substrate, forming a first gate structure over the body region and the drift region, forming a second gate structure over the drift region, forming a source in the body region, and forming a drain in the drift region. The first gate structure is between the source and the drain. The second gate structure is between the first gate structure and the drain.

Another aspect of the present disclosure provides a semiconductor structure that includes a substrate, a body region and a drift region in the substrate, a gate structure having a gate electrode over the body and drift regions, a first dielectric layer between the gate electrode and the body and drift regions, a dielectric structure including a second dielectric layer penetrating through the drift region, a source in the body region, and a drain in the drift region. The first and second dielectric layers have a same material and a same structure. The gate structure is between the source and the drain. The dielectric structure is between the gate structure and the drain.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
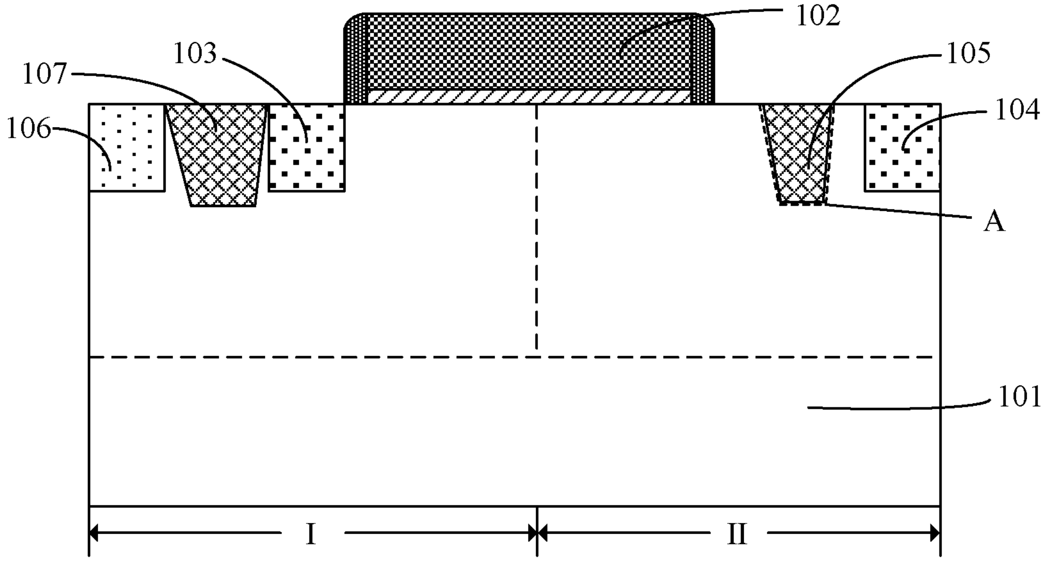
FIG. 1 illustrates a cross-sectional view of a semiconductor structure.

FIG. 1 shows a cross-sectional view of a semiconductor structure for making LDMOS devices. The semiconductor structure includes a substrate 101, a gate electrode 102 above a surface of the substrate 101, a source 103 and a drain 104 in the substrate 101 and on the opposite sides of the gate electrode 102, a first isolation layer 105 on a side of the gate electrode 102 and between the gate electrode 102 and the drain 104, a lead-out channel region 106, and a second isolation layer 107 between the source 103 and the lead-out channel region 106. The substrate 101 contains a body region I and a drift region II that is adjacent to the body region I. The gate electrode covers part of the body region I and part of the drift region II. The source 103 and lead-out channel region 106 are located in the body region I, while the drain 104 and the first isolation layer 105 are located in the drift region II. The drain 104 is closer to the first isolation layer 105 with respect to the gate electrode 102.

In LDMOS devices with the structure as shown in FIG. 1, the first isolation layer 105 may include a shallow trench isolation (STI) structure, and is used to increase the breakdown voltage. During an STI process to make the STI structure, a trench is formed in the substrate 101 first. Then oxide materials are deposited in the trench, followed by high temperature annealing.

However, the high temperature annealing may cause re-growth of oxide layers at an interface A between the first isolation layer 105 and the substrate 101. Consequently, a large number of interface defects may form around the interface A. The interface defects may affect the performance and reliability of the LDMOS device, and even cause device failure. Assuming the semiconductor structure shown in FIG. 1 is a P-type LDMOS (PLDMOS) device. When a negative voltage is applied to the gate electrode 102, the hot carrier effect may occur. Some hot carriers may go around the first isolation layer 105 to enter the drain 104. However, a large amount of positive charges may accumulate near the interface A, as the interface defects may create certain donor-like confinement. The accumulated positive charges may reduce the current that enters the drain 104 through the drift region II, and even cause shutdown of the device. As such, the performance and reliability of the LDMOS device may be seriously affected.

The present disclosure provides semiconductor structures and fabrication methods thereof to solve above-described problems. For example, a second gate structure may be formed in the drift region. The second gate structure is configured between a first gate structure and a drain. By applying a reverse voltage on the second gate structure, the accumulation of charges at the interface between the bottom of the second gate structure and the substrate may be reduced. It may reduce the influence of the defects on the device currents, and improve the performance and reliability of the device.

In order to elaborate the above-mentioned purposes, features and beneficial effects of the present invention, embodiments of the present invention are described in detail below in conjunction with the accompanying drawings.

Figure 2:
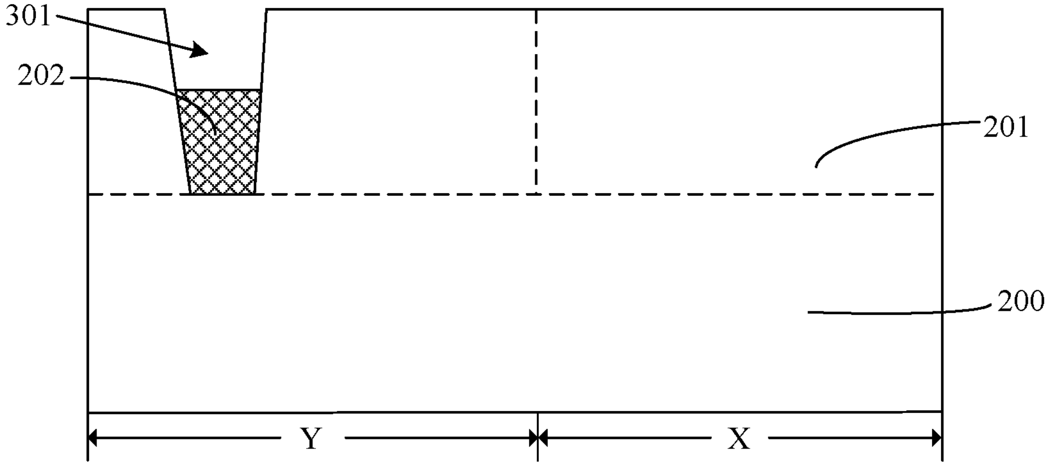
FIGS. 2-10 illustrate cross-sectional views corresponding to certain stages for forming an exemplary semiconductor structure according to various disclosed embodiments.

FIGS. 2-10 show cross-sectional views corresponding to certain stages of forming an exemplary semiconductor structure according to the present disclosure. The semiconductor structure depicted in the figures may represent and be referred to as a LDMOS device. Referring to FIG. 2, a substrate 200 is provided. In some embodiments, the substrate 200 may include single crystalline silicon. In some other embodiments, the substrate 200 may include polycrystalline silicon or amorphous silicon, a semiconductor material such as germanium (Ge), silicon germanium (SiGe), and gallium arsenide (GaAs), or a semiconductor-on-insulator structure. An active region 201, a drift region X, and a body region Y are formed in the substrate 200. The drift region X and body region Y are adjacent to each other in the active region 201. In some embodiments, the active region 201 may have a fin structure. In some other cases, the active region 201 may have a planar structure.

A first isolation layer (not shown) is formed around the active region 201, and the top surface of the first isolation layer may be lower than the top surface of the active region 201. The method for forming the first isolation layer may include: Etching the substrate 200 to form a trench (not shown) between the active region 201 and regions adjacent to the active region 201; forming a first isolation material layer (not shown) in the trench; and etching back the first isolation material layer to form the first isolation layer with a top surface lower than the top surface of the active region 201. Optionally, the top surface of the first isolation layer may be flush with the top surface of the active region 201 in some other cases. After the first isolation material layer is made, an annealing process may be performed on the first isolation material layer.

Further, another trench is etched in the body region Y, and a third isolation layer 202 is formed in this trench for isolation between a source region and a lead-out channel region that are made later. Optionally, the top surface of the third isolation layer 202 may be flush with the surface of the first isolation layer.

The two trenches may be etched concurrently, followed by forming the first isolation material layer. The first isolation material layer may be etched back to form the first isolation layer, the third isolation layer 202, and an opening 301 above the third isolation layer 202. As the first isolation layer and the third isolation layer 202 are formed concurrently, process steps may be reduced.

Figure 3:
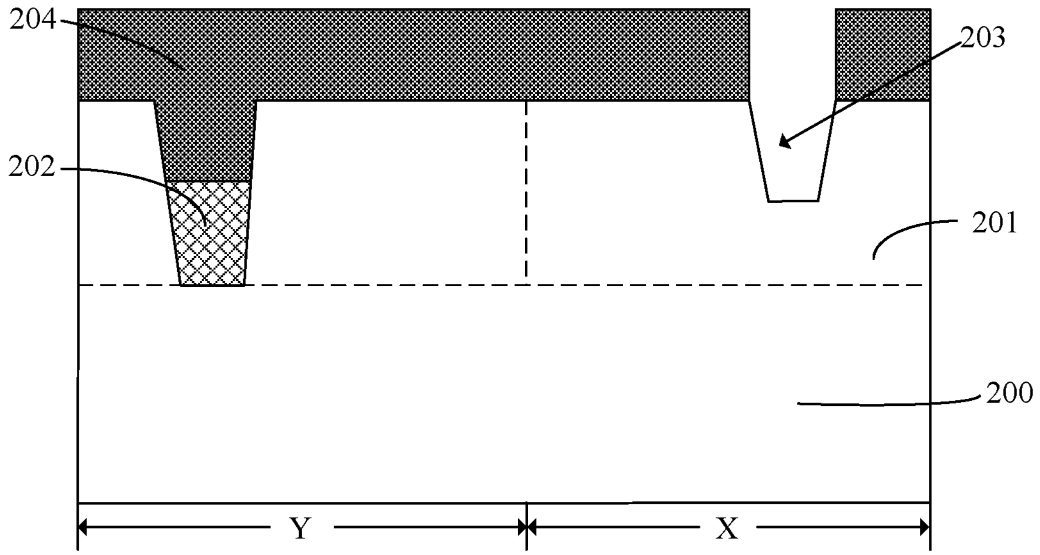

Referring to FIG. 3, an isolation trench 203 is formed in the drift region X. The isolation trench 203 partially penetrates the substrate 200 and extends to a certain depth (e.g., xx nm) in a direction approximately perpendicular to the substrate 200. Optionally, the isolation trench 203 may be formed after the first isolation layer is fabricated. The method for forming the isolation trench 203 may include forming a first mask layer 204 over the surfaces of the active region 201 and the first and third isolation layers. The first mask layer 204 is patterned to expose a part of the surface of the drift region X. With the first mask layer 204 as a mask, the active region 201 is etched to make the isolation trench 203. After the isolation trench 203 is made, the mask layer 204 is removed. The first and third isolation layers and the opening 301 are exposed after the first mask layer 204 is removed.

Further, a first gate structure is formed over the substrate 200, and a second gate structure is formed in the isolation trench 203. The first and second gate structures include a first and a second gate electrode, respectively. A source is formed on one side of the first gate structure in the body region Y, and a drain is formed on the other side of the first gate structure in the drift region X. Part of the first gate structure is located over the drift region X, while another part of the first gate structure is located over the body region Y. The first gate structure is configured between the source and the drain, and the second gate structure is configured between the first gate structure and the drain. The second gate structure includes a second isolation layer, which is arranged between the surface of the isolation trench 203 and a second gate electrode of the second gate structure.

Optionally, surface treatment may be performed on the side and bottom surfaces of the isolation trench 203 after etching the isolation trench 203 and before forming the second isolation layer. The surface treatment may reduce the defect density at the interface between the second isolation layer and the substrate 200, and reduce the influence of interface defects on the device performance. In some cases, after forming the isolation trench 203 and before making the second isolation layer, surface treatment may also be conducted on the surface of the active region 201, which may make the surface of the active region 201 smoother.

In some embodiments, the first and second gate structures may be fabricated simultaneously. In some other embodiments, the second gate structure may be made before forming the first gate structure. Alternatively, the second gate structure may be made after forming the first gate structure.

Figure 4:
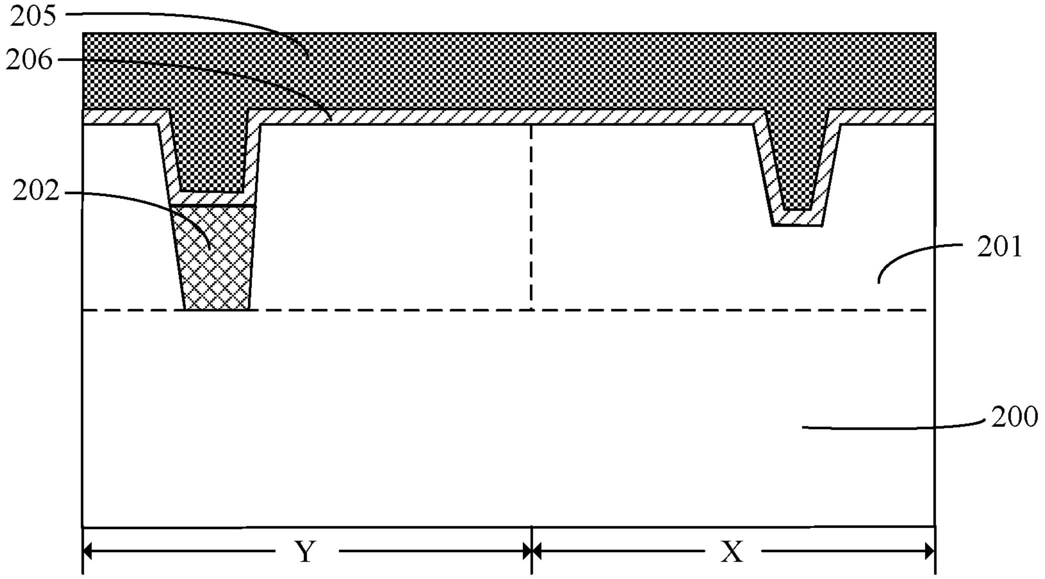

FIGS. 4-10 illustrate methods of forming the first and second gate structures schematically according to the present disclosure. Referring to FIG. 4, a dummy gate material layer 205 is formed over the surface of the substrate 200 and in the isolation trench 203. The dummy gate material layer 205 is used to pre-occupy certain space for subsequent formation of the first and second gate structures.

Before forming the dummy gate material layer 205, a second isolation material layer 206 is formed over the surface of the substrate 200, and the sides and the bottom surface of the isolation trench 203. The second isolation material layer 206 may be used for subsequent formation of a gate dielectric layer and the second isolation layer. The gate dielectric layer and second isolation layer may be formed in the same process concurrently, which may reduce process steps and save costs.

In some embodiments, the second isolation material layer 206 includes a silicon oxide layer that may be formed by an oxidation process such as an in-situ steam generation (ISSG) process. The ISSG process may enhance the uniformity of the second isolation material layer 206. Optionally, the second isolation material layer 206 may also be formed by a deposition process, such as chemical vapor deposition (CVD) or atomic layer deposition (ALD). The second isolation material layer 206 made by the deposition process may include a high-k dielectric material such as aluminum oxide ($Al_2O_3$) or hafnium oxide ($HfO_2$). In descriptions below, the second isolation material layer 206 is a silicon oxide layer exemplarily.

The second isolation material layer 206 also covers the sides and bottom surface of the opening 301. In some embodiments, the thickness of the second isolation material layer 206 may range from 30 Å to 100 Å.

Figure 5:
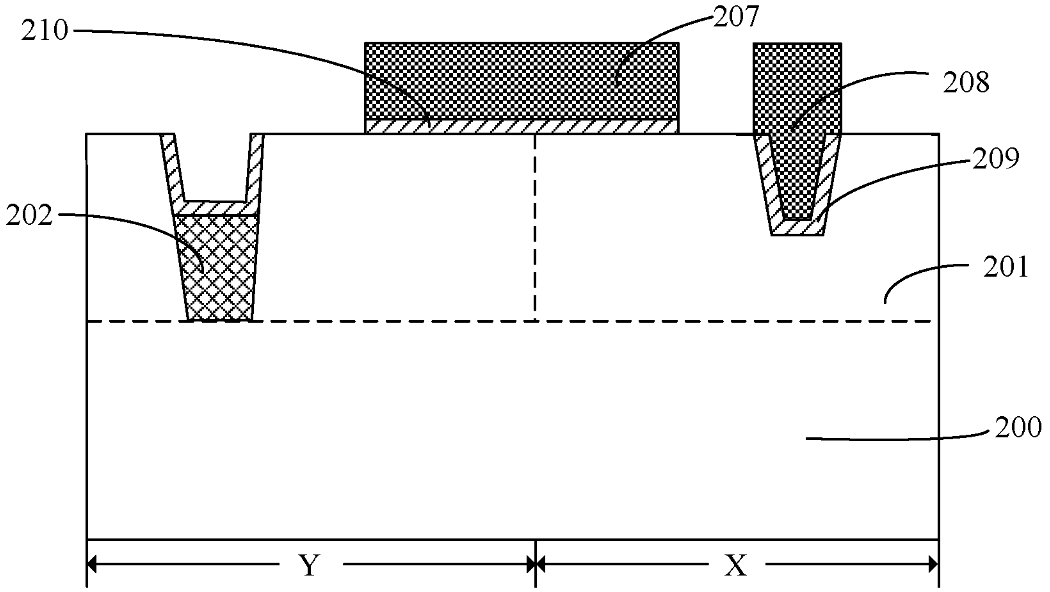

Referring to FIG. 5, the dummy gate material layer 205 is patterned. As a result, the surface of the substrate 200 is exposed, a first dummy gate 207 is formed over part of the surface of the substrate 200, and a second dummy gate 208 is formed in the isolation trench 203. A part of the first dummy gate 207 is arranged over the drift region X, and another part of the first dummy gate 207 is arranged over the body region Y. The first dummy gate 207 pre-occupies certain space for the subsequent formation of the first gate structure, while the second dummy gate 208 pre-occupies certain space for the subsequent formation of the second gate structure.

As shown in FIG. 5, the second isolation material layer 206 is etched into a first gate oxide layer 210 and a second isolation layer 209 by an etch process. The first gate oxide layer 210 is formed between the first dummy gate 207 and a surface of the substrate 200. The second isolation layer 209 is formed between the second dummy gate 208 and the surface of the isolation trench 203. In some embodiments, the thickness of the second isolation layer 209 may range from 30 Å to 100 Å.

The second isolation layer 209, located in the drift region X, may increase the breakdown voltage and improve the performance of the LDMOS device. In addition, since the second isolation layer 209 is formed in the isolation trench 203 and made after the fabrication of the first isolation layer with the STI process, interface defects between the second isolation layer 209 and the substrate 200 may be reduced, thereby reducing the impact of the interface defects on device currents and improving the stability of device performance.

Further, a drain 212 is formed in the drift region X. The second isolation layer 209 is over the drift region X and between the first gate structure and the drain 212, which may further increase the breakdown voltage of the LDMOS device.

Figure 6:
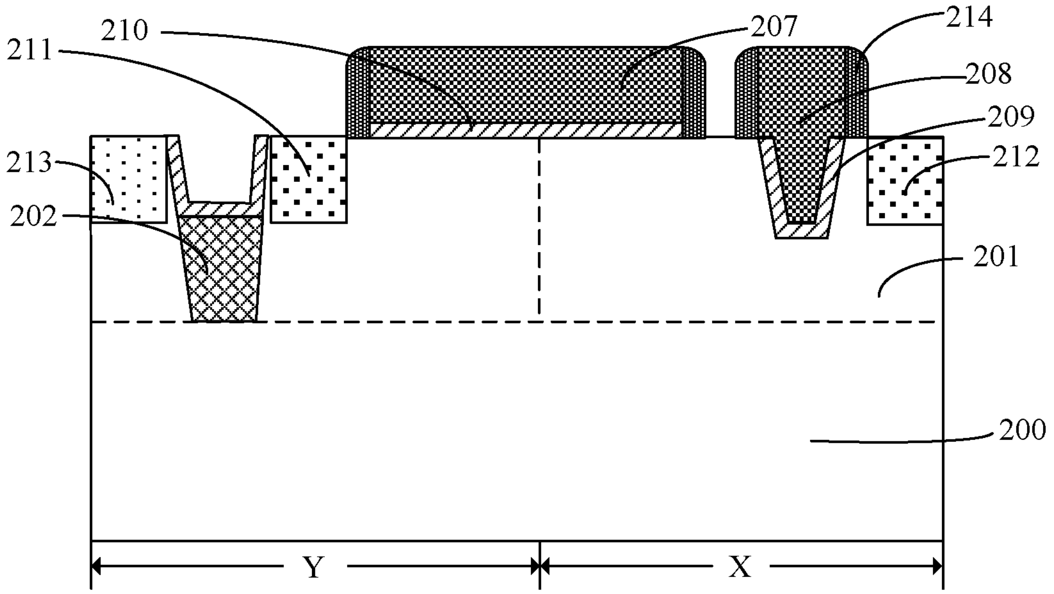

FIG. 6 illustrates certain exemplary methods to form the source and drain according to the present disclosure. After forming the first and second dummy gates 207 and 208, and before making the first and second gate structures, a source 211 is formed on one side of the first dummy gate 207 in the body region Y, and the drain 212 is formed on the other side of the first dummy gate 207 in the drift region X. A lead-out channel region 213 is formed in the body region Y, and the third isolation layer 202 is arranged between the source 211 and the lead-out channel region 213. After making the first and second dummy gates 207 and 208, and before making the source 211 and the drain 212, sidewalls 214 are formed on the sides of the first and second dummy gates 207 and 208.

In some embodiments, the source 211 and drain 212 may be formed after the first and second dummy gates 207 and 208 are made and before the first and second gate structures are formed. Optionally, the source 211 and the drain 212 may also be formed after the first and second gate structures are made and before a first dielectric layer 215 is formed. As aforementioned, the source 211 is on one side of the first gate structure in the body region Y, while the drain 212 is on the other side of the first gate structure in the drift region X.

Figure 7:
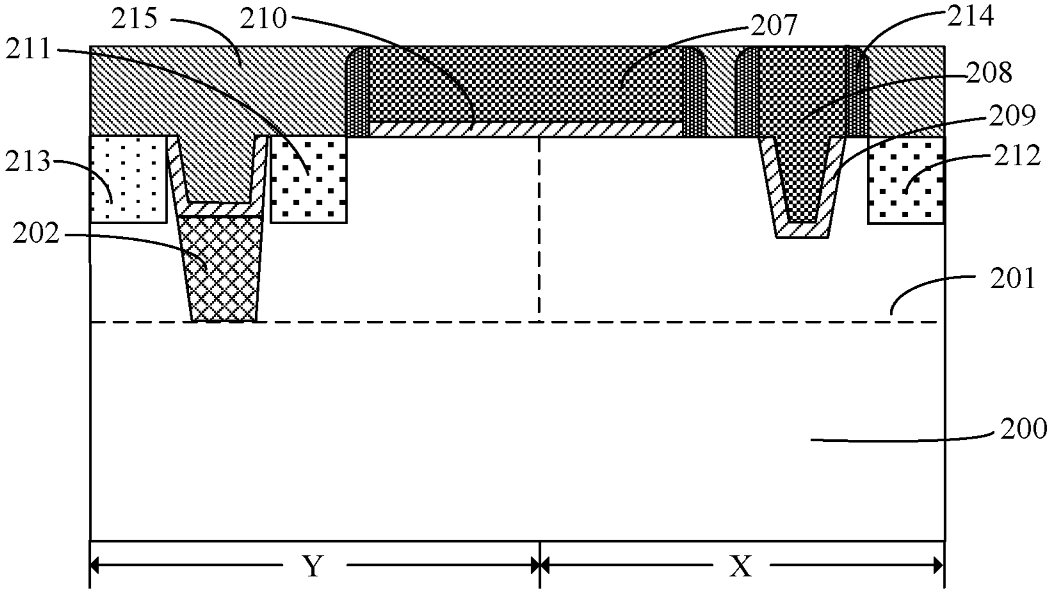

Referring to FIG. 7, the first dielectric layer 215 is formed over the substrate 200. The first dielectric layer 215 is patterned such that it exposes the top surfaces of the first and second dummy gates 207 and 208. A portion of the first dielectric layer 215 is formed in the opening 301. After the first dielectric layer 215 is made, a first gate electrode 218 and a second gate electrode 219 are formed, replacing the first and second dummy gates 207 and 208, respectively. Both the second isolation layer 209 and second gate electrode 219 partially penetrate through the substrate 200 and extend to certain depths in a direction approximately perpendicular to the substrate 200, respectively.

Figure 8:
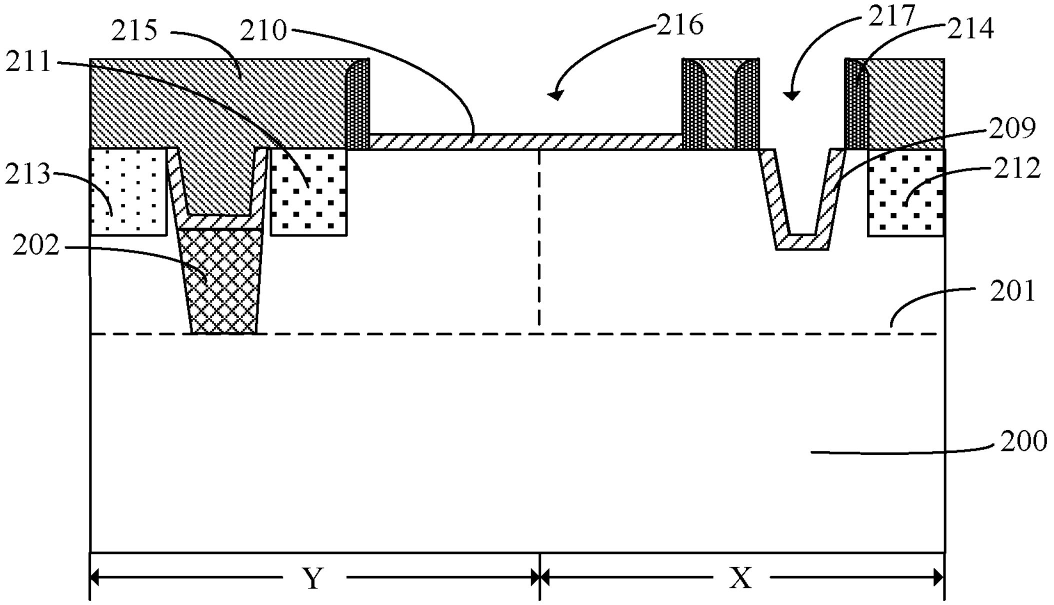
Figure 9:
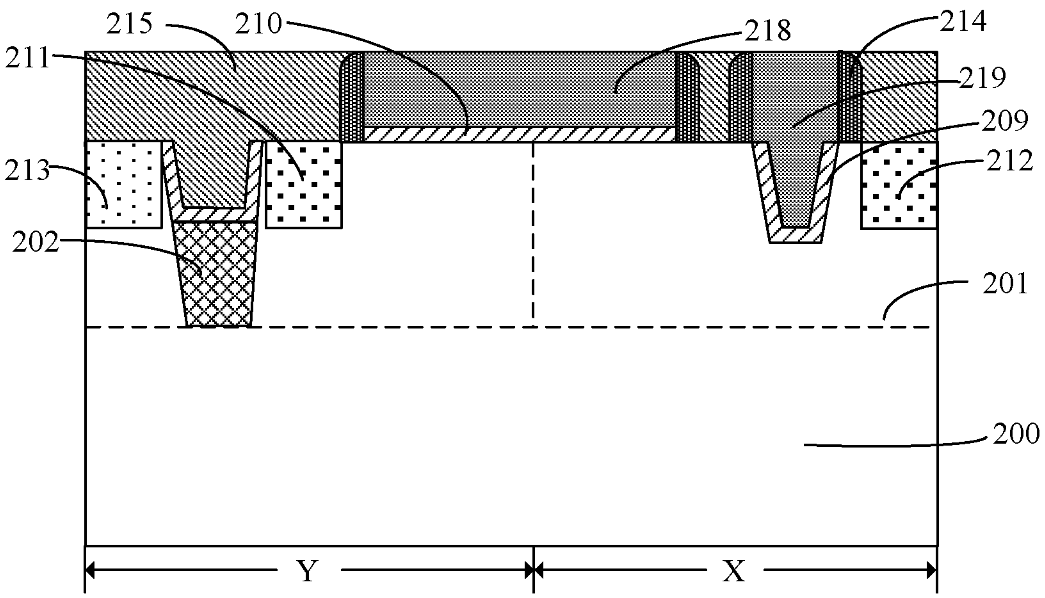

FIGS. 8 and 9 illustrate methods to fabricate the first and second gate electrodes 218 and 219 exemplarily according to the present disclosure. As shown in FIG. 8, a first gate groove 216 is made after removing the first dummy gate 207, and a second gate groove 217 is made after removing the second dummy gate 208. The first and second gate grooves 216 and 217 are surrounded by the sidewalls 214 and the first dielectric layer 215. Optionally, the first and second dummy gates 207 and 208 may be removed concurrently in the same process, which may reduce fabrication steps. The first and second dummy gates 207 and 208 may be removed by an etch process, such as a dry etch process, a wet etch process, or a combination of dry and wet etch processes. The first gate oxide layer 210 is arranged between the subsequently formed first gate electrode 218 and the substrate 200, and may serve as a thick gate oxide layer of the first gate structure.

Referring to FIG. 9, the first gate electrode 218 is formed in the first gate groove 216, and the second gate electrode 219 is formed in the second gate groove 217. The first and second gate structures include the first and second gate electrodes 218 and 219, respectively. In some embodiments, the dimension of the second gate electrode 219 along a direction (e.g., a direction passing through the source 211 and drain 212) parallel to the surface of the substrate 200 may be between 20 nm to 1000 nm.

The second gate structure is configured in the drift region X and between the first gate structure and the drain 212. By applying a reverse voltage on the second gate structure, the accumulation of charges at the interface between the bottom of the second gate structure and the substrate 200 may be reduced. Thus, the influence of defects at the interface on the device performance may be decreased, and the reliability of the LDMOS device may be improved.

The second gate structure includes the second isolation layer 209 between the surface of the isolation trench 203 and the second gate electrode 219. The second isolation layer 209 may reduce the impact of interface defects on device performance and improve the stability of device performance. In some other embodiments, the reverse voltage is not applied to the second gate structure.

The method of forming the first and second gate structures may further include depositing a gate material layer (not shown) in the first and second gate grooves 216 and 217 and on the surface of the first dielectric layer 215. For example, the gate material layer may be planarized until the surface of the first dielectric layer 215 is exposed. A portion of the gate material layer in the first gate groove 216 becomes the first gate electrode 218, and a portion of the gate material layer in the second gate groove 217 becomes the second gate electrode 219. The gate material layer may include a metallic material such as aluminum (Al), copper (Cu), tungsten (W), or gold (Au). An exemplary material for the gate material layer is W in descriptions below.

In some embodiments, the first gate structure further includes a first gate dielectric layer (not shown) and a first work function layer (not shown) formed on the first gate dielectric layer. The first gate electrode 218 is formed over the first work function layer.

In some embodiments, the second gate structure further includes a second gate dielectric layer (not shown) and a second work function layer (not shown) formed on the second gate dielectric layer. The second gate electrode 219 is made over the second work function layer. Optionally, the second gate dielectric layer may be formed over the second isolation layer 209.

The method of making the first and second gate structures further includes before forming the gate material layer, forming a gate dielectric material layer (not shown) in the first and second gate grooves 216 and 217, and over the surface of the first dielectric layer 215. The method further includes forming a work function material layer (not shown) over the gate dielectric material layer. The gate material layer, the work function material layer, and the gate dielectric material layer may be planarized until the surface of the first dielectric layer 215 is exposed. A portion of the gate dielectric material layer in the first gate groove 216 becomes the first gate dielectric layer, and a portion of the work function material layer in the first gate groove 216 becomes the first work function layer. Similarly, a portion of the gate dielectric material layer in the second gate groove 217 becomes the second gate dielectric layer, and a portion of the work function material layer in the second gate groove 217 becomes the second work function layer. In some cases, the material of the gate dielectric material layer may be $HfO_2$ exemplarily. Optionally, the material of the work function material layer may include one or more of titanium nitride (TiN), tantalum nitride (TaN), titanium aluminide (TiAl), and molybdenum nitride (MoN). In descriptions below, the exemplary material of the work function material layer is TaAlN.

Figure 10:
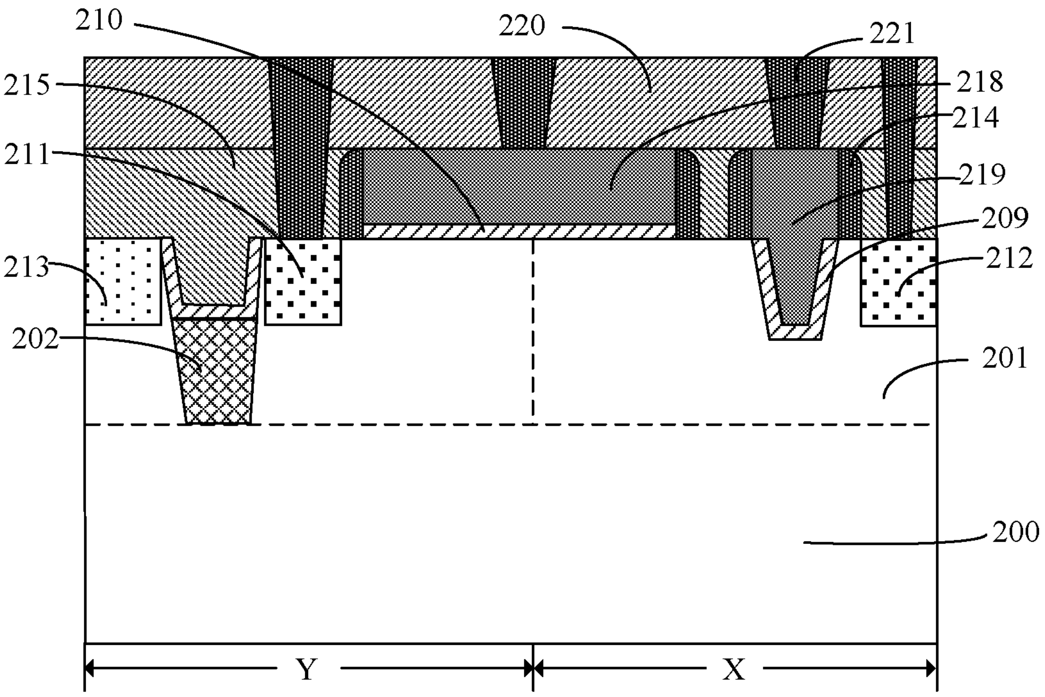

As shown in FIG. 10, an electrically conductive structure 221 is formed over the source 211, the drain 212, and the first and second gate electrodes 218 and 219. As aforementioned, a reverse voltage may be applied to the second gate electrode 219 in some cases. That is, the second gate electrode 219 may be reversely biased. In some other cases, the conductive structure 221 is not configured over the second gate electrode 219. In such cases, the second gate electrode 219 may be isolated electrically so that an electrical voltage cannot be applied to the second gate electrode 219.

Optionally, a second dielectric layer 220 may be deposited over the surface of the first dielectric layer 215 and the first and second gate structures. The electrically conductive structure 221 may be made in the second dielectric layer 220, e.g., be surrounded by the second dielectric layer 220.

As shown in FIG. 10, the LDMOS device includes the substrate 200 and the active region 201 in the substrate 200. The active region 201 includes adjacent drift region X and body region Y. The isolation trench 203 is arranged in the drift region X. The first gate structure is formed over part of the surface of the substrate 200. The first gate structure includes the first gate electrode 218. Part of the first gate structure 218 is located over the drift region X, and another part of the first gate structure 218 is located over the body region Y.

The second gate structure is formed in the isolation trench 203 and includes the second gate electrode 219. The top surface of the second gate structure is higher than the top surface of the active region 201. The source 211 in the body region Y and the drain 212 in the drift region X are respectively arranged on the opposite sides of the first gate structure, and the second gate structure is between the first gate structure and the drain 212. The sidewalls 214 are formed on the sides of the first and second gate structures. The first dielectric layer 215 is formed over the surface of the substrate 200. The first dielectric layer 215 also surrounds the sides of the first and second gate structures, while does not cover the top surfaces of the first and second gate electrodes 218 and 219. The conductive structure 221 is arranged over and electrically connected to the source 211, the drain 212, and the first and second gate structures, respectively.

The second gate structure is formed between the first gate structure and the drain 212 in the drift region X. When a reverse voltage is applied on the second gate structure, the accumulation of charges at the interface between the bottom of the second gate structure and the substrate 200 may be reduced, thereby reducing the influence of defects at the interface on the device performance. It may improve the reliability of the LDMOS device. The dimension of the second gate 219 along a direction parallel to the surface of the substrate 200 may be between 20 nm to 1000 nm exemplarily in some aspects.

The second gate structure includes the second isolation layer 209 between the surface of the isolation trench 203 and the second gate electrode 219. The thickness of the second isolation layer 209 may range from 30 Å to 100 Å exemplarily. The material of the second gate electrode 219 may include a metal such as Al, Cu, W, or Au.

The second isolation layer 209 is located in the drift region X, and between the first gate structure and the drain. The second isolation layer 209 may improve the breakdown voltage performance of the device. Since the second isolation layer 209 is located in the isolation trench 203 and formed after the first isolation layer formation process (i.e., the STI process), interface defects between the second isolation layer 209 and the substrate 200 may be reduced, thereby reducing the impact of the interface defects on device performance. The stability of device performance may be improved.

In some embodiments, the first gate structure includes the first gate electrode 218. The material of the first gate electrode 218 may include a metal such as Al, Cu, W, or Au.

In some embodiments, the first isolation layer (not shown) is configured around the active region 201.

In some cases, the active region 201 has a fin structure. In some other cases, the active region 201 has a planar structure.

In some cases, the top surface of the first isolation layer is lower than the top surface of the active region 201. In some other cases, the top surface of the first isolation layer is flush with the top surface of the active region 201. In some aspects, the conductive structure 221 is located over the second gate structure.

Figure 11:
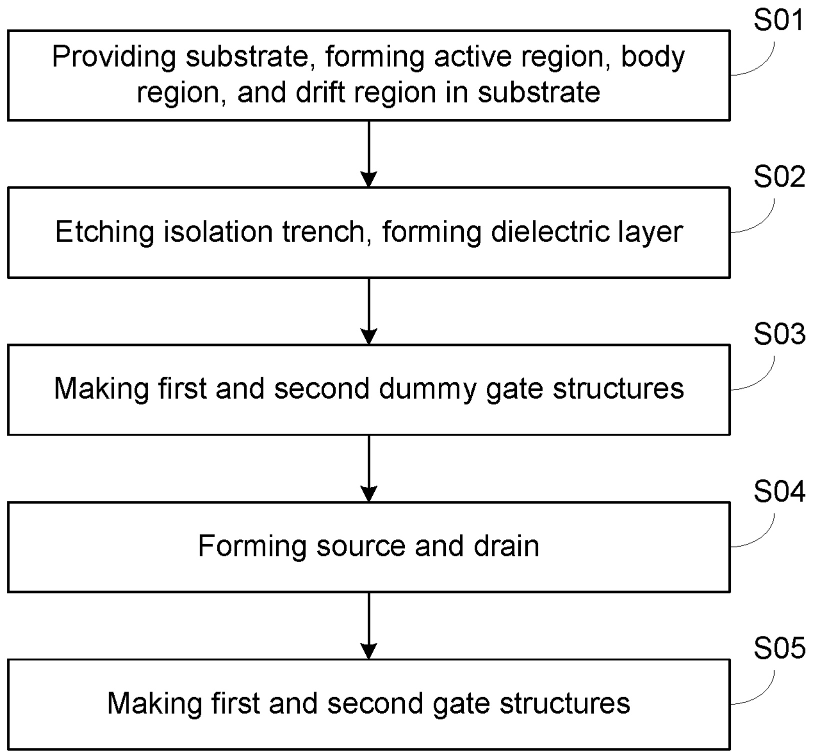
FIG. 11 illustrates an exemplary method for forming a semiconductor structure according to various disclosed embodiments of the present disclosure.

FIG. 11 shows a schematic flow chart to illustrate methods for forming a semiconductor structure according to the present disclosure. The exemplary semiconductor structure may represent and be referred to as a LDMOS device. At S01, a substrate is provided for making the LDMOS device. The substrate may contain a semiconductor material such as single crystalline silicon. An active region, body region, and drift region are formed in the substrate by, e.g., ion implantation (e.g., the active region 201, drift region X, and body region Y in the substrate 200 as shown in FIG. 2). The body region and drift region are adjacent in the active region. A high-temperature STI process may be performed to make an isolation region that surrounds the active region.

At S02, an etch process is performed on the substrate. An isolation trench is etched in the drift region by a dry etch, wet etch, or a combination of dry and wet etches. The isolation trench partially penetrates through the substrate and extends to a certain depth in a direction approximately perpendicular to the substrate (e.g., the isolation trench 203 shown in FIG. 3). The isolation trench may be formed after the STI process is conducted to avoid the effect of high temperatures.

Thereafter, a dielectric layer is formed over the top surface of the substrate and the side and bottom surfaces of the isolation trench (e.g., the second isolation material layer 206 as shown in FIG. 4). The dielectric layer may be a silicon oxide layer made by the ISSG process. Alternatively, the dielectric layer may be formed by a deposition process via CVD or ALD and contain silicon oxide or another dielectric material.

At S03, the dielectric layer is etched to create a first gate dielectric layer for a first gate structure and an isolation layer for a second gate structure. The first gate electric layer covers parts of both the body and drift regions. The isolation layer is formed over the drift region and on the sides and bottom of the isolation trench, and may serve as a second gate dielectric layer for the second gate structure (e.g., the first gate oxide layer 210 and second isolation layer 209 as shown in FIG. 5). Further, first and second dummy gate structures may be made over the first gate dielectric layer and the isolation layer, respectively.

At S04, a source and a drain are formed by, e.g., an ion implantation process (e.g., the source 211 in the body region Y and the drain 212 in the drift region X as shown in FIG. 6). The first and second dummy gate structures occupy positions of the first and second gate structures, respectively. The first and second gate structures are between the source and drain. The first gate structure is over adjacent parts of the body and drift regions and between the source and the second gate structure. The second gate structure is over the drift region and between the first gate structure and the drain.

At S05, the first and second dummy gate structures are removed and replaced by the first and second gate structures, respectively. The first and second gate structures contain a first gate electrode and a second gate electrode made of an electrically conductive material, respectively (e.g., the first gate electrode 218 and the second gate electrode 219 as shown in FIG. 9). The second gate electrode is formed over the isolation layer in the isolation trench. The isolation layer and second gate electrode are between the source and drain and between the first gate structure and the drain. Along a direction approximately perpendicular to the substrate, the isolation layer and second gate electrode penetrate into the drift region to certain depths in the substrate, respectively.

The second gate electrode may be reversely biased to reduce charge accumulation around the interface between the isolation layer and the substrate (or the drift region) during an operation of the LDMOS device. Alternatively, the second gate electrode may be electrically disconnected or electrically isolated. As the isolation layer is made after the high-temperature STI process, fewer defects are formed at the interface. In such cases, the performance and reliability may still be improved without applying a reverse voltage to the second gate electrode.

In some embodiments, the second dummy gate structure and second gate structure are not made for an alternative LDMOS device. For example, at S03, the first dummy gate structure may be fabricated. However, instead of the second dummy gate structure, a dielectric material (e.g., an oxide material) may be deposited over the isolation layer to form a dielectric body that fills the isolation trench (e.g., the isolation trench 203 shown in FIG. 3). CVD may be used in the deposition process. The isolation layer in the isolation trench and the dielectric body form a dielectric structure between the source and drain and between the first gate structure and drain. Along a direction approximately perpendicular to the substrate, the dielectric structure penetrates into the drift region to a certain depth in the substrate. Like the layers 209 and 210 of the LDMOS device shown in FIG. 10, the isolation layer (in the isolation trench) and the first gate dielectric layer of the alternative LDMOS may be made by the same process concurrently, and thus may have the same thickness, the same materials, and the same structure. Further, the alternative LDMOS device and the LDMOS device shown in FIG. 10 may have similar structures, and a difference between them is that the alternative LDMOS device has the dielectric block instead of the second gate structure containing the second gate electrode. As the isolation layer (in the isolation trench) of the alternative LDMOS device is made after the STI process, fewer defects are formed at the interface between the isolation layer and the drift region. Hence, the performance and reliability may be improved as well.

Compared with the existing technologies, the above-illustrated embodiments of the present disclosure have the following advantages.

In the methods for forming a semiconductor structure provided by the present disclosure, a second gate structure is arranged in the drift region. The second gate structure is located between the first gate structure and the drain. By applying a reverse voltage on the second gate structure, charge accumulation at the interface between the bottom of the second gate structure and the substrate may be reduced. Thus, the influence of defects at the interface on the device circuit may be reduced and the performance of the device may be improved.

Further, a first isolation layer is formed around the active region. After forming the first isolation layer, the isolation trench is formed. The second gate structure includes a second isolation layer. The second isolation layer located in the drift region may improve the breakdown voltage of the device. Since the second isolation layer is located in the isolation trench and formed after the formation process of the first isolation layer (i.e., the STI process), interface defects between the second isolation layer and the substrate may be reduced. Thereby the impact of the interface defects on device performance may be reduced, and the stability of device performance may be improved. Since the second isolation layer may reduce the impact of interface defects on device performance and improve the stability of device performance, a reverse voltage may not be applied on the second gate structure in some aspects.

Further, after forming the isolation trench and before forming the second isolation layer, surface treatment on the sidewall and bottom surface of the isolation trench may be carried out. The surface treatment may reduce the defect density at the interface between the second isolation layer and the substrate, and reduce the impact of interface defects on device performance.

In the semiconductor structure provided by the embodiments of the present disclosure, the second gate structure is arranged in the drift region. The second gate structure is configured between the first gate structure and the drain. By applying a reverse voltage on the second gate structure, charge accumulation at the interface between the bottom of the second gate structure and the substrate may be reduced. As such, the influence of defects at the interface on the device circuit may be decreased, thereby improving the performance of the device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
a substrate;
a body region and a drift region in the substrate;
a first gate structure over the body region and the drift region;
a second gate structure over the drift region;
a source in the body region; and
a drain in the drift region, the first gate structure being between the source and the drain, and the second gate structure being between the first gate structure and the drain and extending through the drift region to a predetermined depth in a direction approximately perpendicular to the substrate.

2. The structure according to claim 1, wherein the second gate structure is arranged in an isolation trench in the drift region.

3. The structure according to claim 2, wherein the second gate structure includes a dielectric layer between a gate electrode of the second gate structure and a bottom surface of the isolation trench.

4. The structure according to claim 3, wherein the dielectric layer penetrates partially through the substrate.

5. The structure according to claim 1, wherein the drift region is adjacent to the body region.

6. The structure according to claim 1, wherein a gate electrode of the second gate structure is reversely biased.

7. The structure according to claim 1, wherein a gate electrode of the second gate structure is isolated electrically.

8. A method for forming a semiconductor structure, comprising:
providing a substrate;
forming a body region and a drift region in the substrate;
forming a first gate structure over the body region and the drift region;
forming a second gate structure over the drift region;
forming a source in the body region; and
forming a drain in the drift region, the first gate structure being between the source and the drain, and the second gate structure being between the first gate structure and the drain and extending through the drift region to a predetermined depth in a direction approximately perpendicular to the substrate.

9. The method according to claim 8, further comprising:
forming an isolation trench in the drift region; and
forming the second gate structure in the isolation trench.

10. The method according to claim 9, further comprising:
forming a second dielectric layer over a bottom surface of the isolation trench.

11. The method according to claim 10, wherein the second dielectric layer penetrates partially through the substrate.

12. The method according to claim 10, further comprising:
forming a first dielectric layer of the first gate structure and the second dielectric layer concurrently.

13. The method according to claim 10, further comprising:
performing an annealing process before forming the second dielectric layer.

14. The method according to claim 8, wherein the drift region is adjacent to the body region.

15. The method according to claim 8, further comprising:
forming a first gate electrode of the first gate structure and a second gate electrode of the second gate structure concurrently.

16. A semiconductor structure, comprising:
a substrate;
a body region and a drift region in the substrate;
a gate structure having a gate electrode over the body and drift regions;
a first dielectric layer between the gate electrode and the body and drift regions;
a dielectric structure including a second dielectric layer penetrating through the drift region and extending to a predetermined depth in a direction approximately perpendicular to the substrate, the first and second dielectric layers having a same material, an approximately same thickness, and a same structure;
a source in the body region; and
a drain in the drift region, the gate structure being between the source and the drain, and the dielectric structure being between the gate structure and the drain.

17. The structure according to claim 16, wherein the dielectric structure is formed in an isolation trench in the drift region, the isolation trench penetrating through the drift region.

18. The structure according to claim 16, wherein the first and second dielectric layers are formed concurrently.

19. The structure according to claim 16, wherein the drift region is adjacent to the body region.

20. The structure according to claim 17, wherein the dielectric structure includes a dielectric body over the second dielectric layer in the isolation trench.

* * * * *